(12) United States Patent
Gidon et al.

(10) Patent No.: US 7,271,375 B2
(45) Date of Patent: Sep. 18, 2007

(54) PHOTODETECTORS ARRAY WITH ISOLATED PIXELS AND STORAGE GRID, HYBRIDIZED ON A READOUT CIRCUIT

(75) Inventors: Pierre Gidon, Echirolles (FR); Philippe Pantigny, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 193 days.

(21) Appl. No.: 10/408,557

(22) Filed: Apr. 8, 2003

(65) Prior Publication Data

US 2003/0222204 A1 Dec. 4, 2003

(30) Foreign Application Priority Data

Apr. 12, 2002 (FR) .................. 02 04614

(51) Int. Cl.
*H01L 27/00* (2006.01)
*H01L 31/00* (2006.01)
(52) U.S. Cl. .............. 250/208.1; 257/443; 257/446
(58) Field of Classification Search ......... 250/214.1, 250/208.1; 257/88, 446, 443, 444
See application file for complete search history.

(56) References Cited

U.S. PATENT DOCUMENTS

| | | | |
|---|---|---|---|
| 4,684,812 A | 8/1987 | Tew et al. | |
| 4,783,594 A * | 11/1988 | Schulte et al. | 250/370.08 |
| 5,563,405 A * | 10/1996 | Woolaway et al. | 250/208.1 |
| 5,591,959 A * | 1/1997 | Cigna et al. | 250/208.1 |
| 5,729,020 A * | 3/1998 | Matsushita et al. | 250/370.08 |
| 5,808,329 A | 9/1998 | Jack et al. | |
| 6,891,242 B2 * | 5/2005 | Gidon et al. | 257/443 |

FOREIGN PATENT DOCUMENTS

| | | |
|---|---|---|
| EP | 0 820 104 | 1/1998 |
| JP | 2001-339057 | 12/2001 |

* cited by examiner

*Primary Examiner*—Georgia Epps
*Assistant Examiner*—Brian Livedalen
(74) *Attorney, Agent, or Firm*—Oblon, Spivak, McClelland, Maier & Neustadt, P.C.

(57) ABSTRACT

The invention relates to a photodetectors array that will be hybridized on a readout circuit (30) and realized from a wafer of semiconducting material (11). The wafer is divided into pixels (12), each pixel forming a photodetector, the pixels being separated from each other by separation means formed in the wafer and comprising a photogrid for photodetectors, each photodetector having a connection pad (18) to hybridize the photodetectors array to the readout circuit.

15 Claims, 9 Drawing Sheets

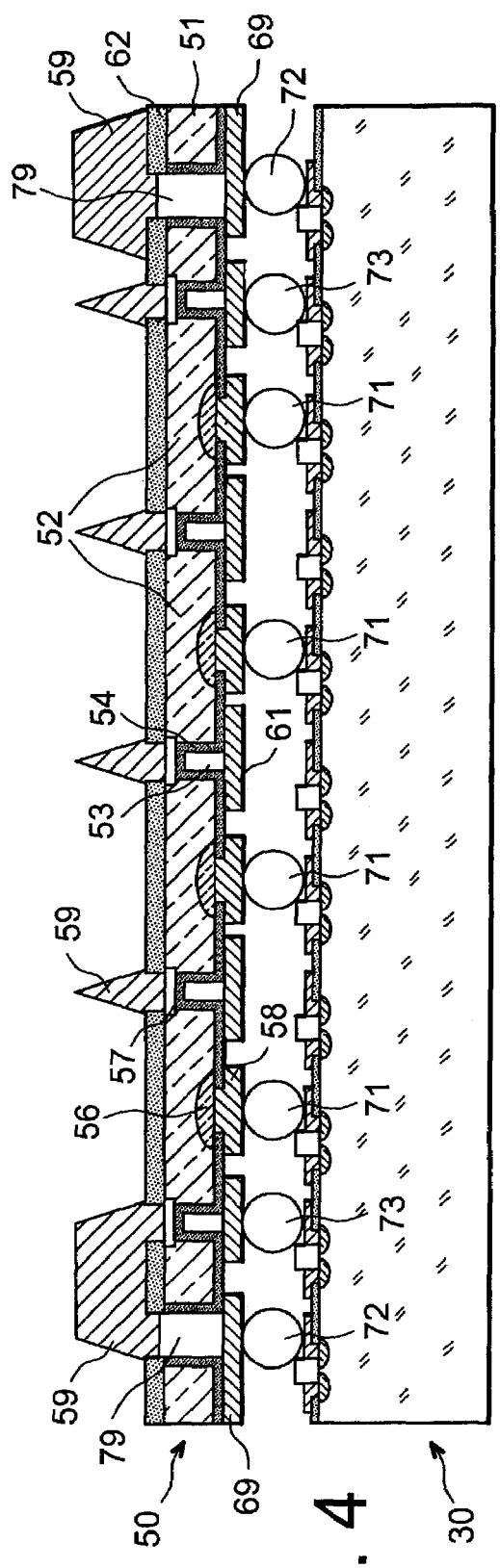
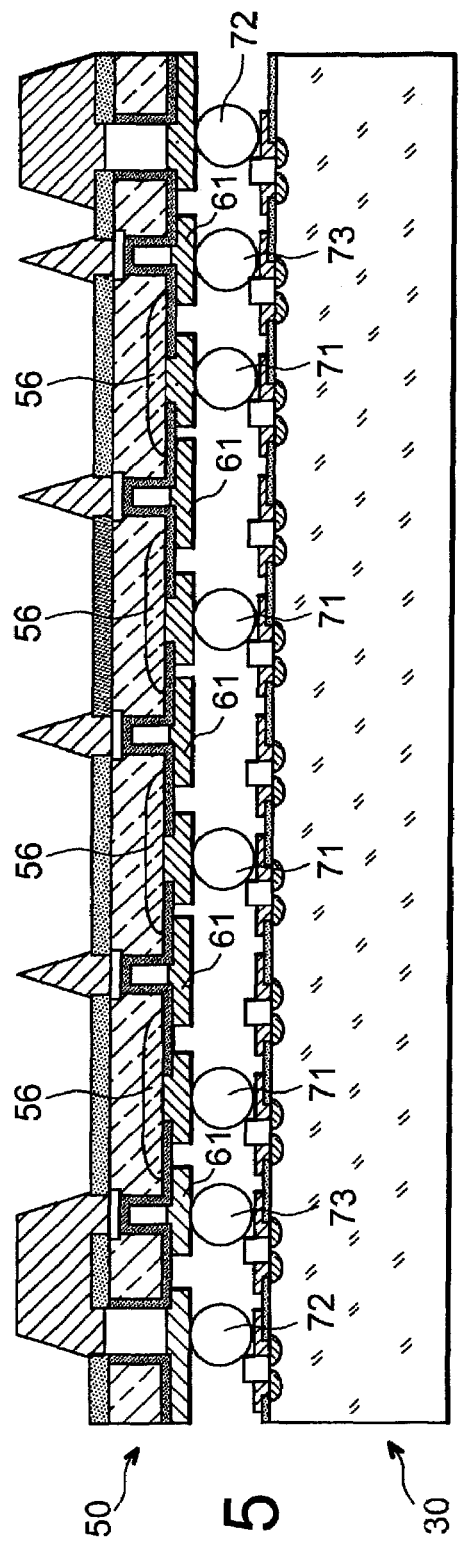
FIG. 4
FIG. 5

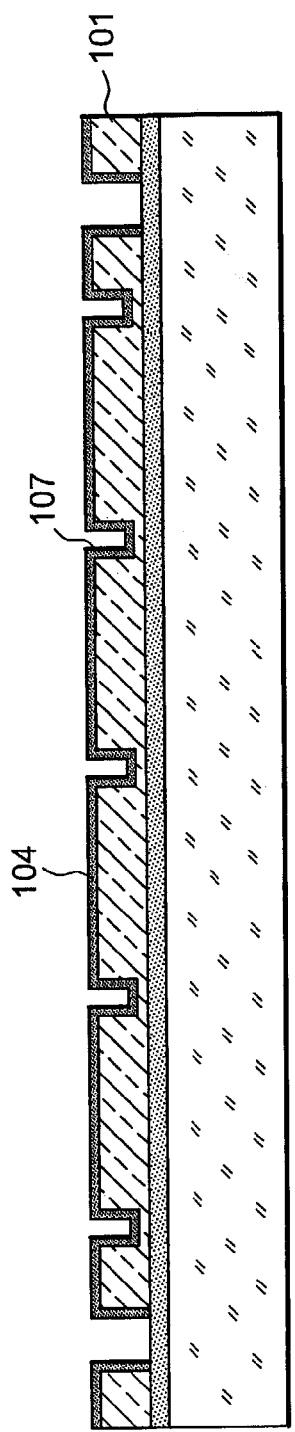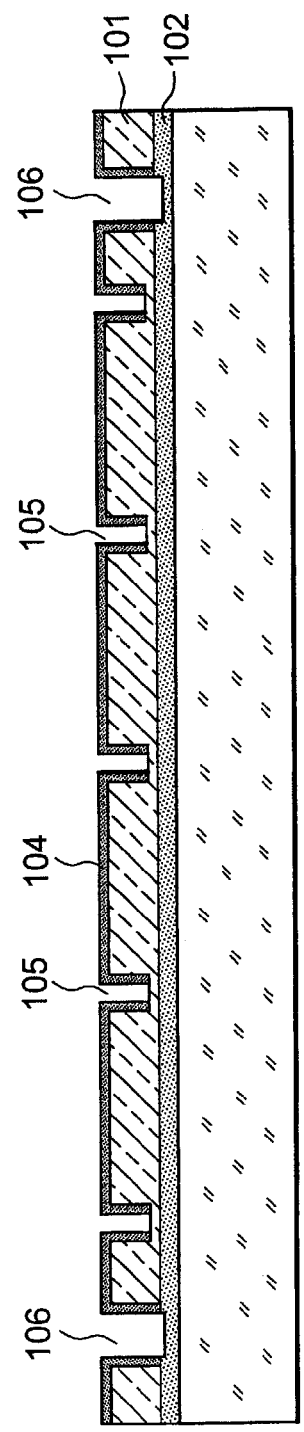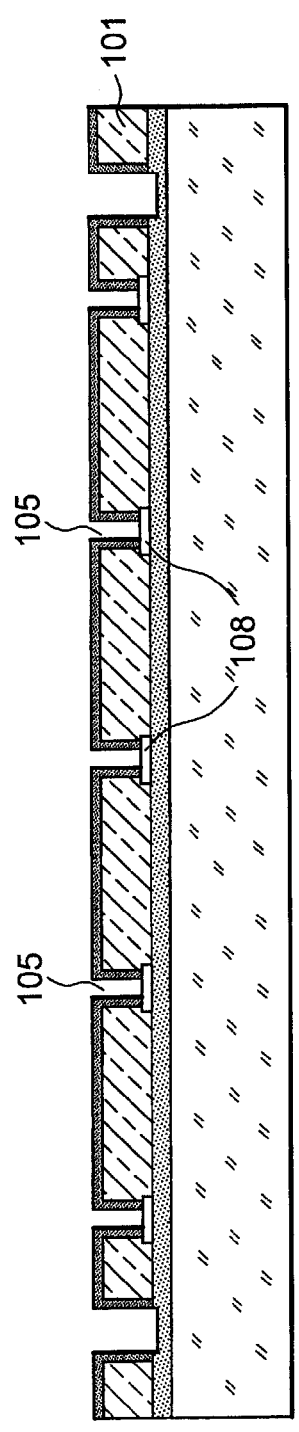

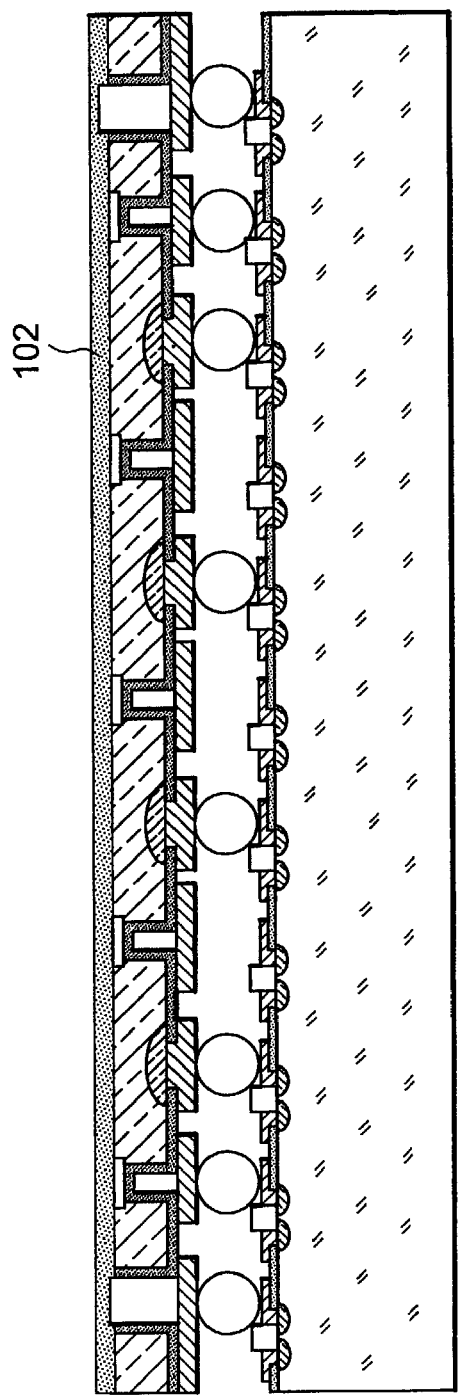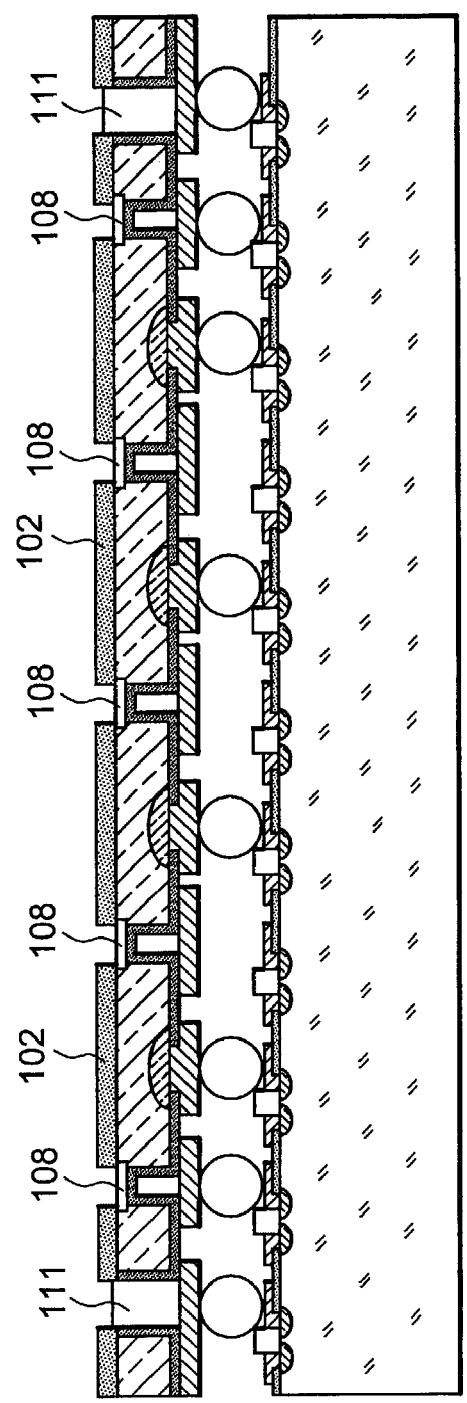
FIG. 6L
FIG. 6M

US 7,271,375 B2

PHOTODETECTORS ARRAY WITH ISOLATED PIXELS AND STORAGE GRID, HYBRIDIZED ON A READOUT CIRCUIT

TECHNICAL FIELD

The invention relates to a photodetectors array with isolated pixels and a photogrid hybridized on a readout circuit.

The purpose of detector arrays is usually to retranscribe images. They may also be used for light signals output from measurement instruments. The light spectrum that they process may vary from the infrared to the ultraviolet. They output electrical signals in relation to the received light intensities. Some output several signals in parallel, either to transmit the information more quickly, or to separate the signals output from different color filters (therefore different wavelengths).

STATE OF PRIOR ART

There are many photodetector array structures.

Some structures have photosensitive sites and signal amplifiers output by sites arranged side by side. Charge storage grids (photogrids) may be used for these structures. By changing the potential of the grid, charges are injected together towards the amplifiers.

Other structures have photosensitive sites located facing amplifiers to avoid losing area on which light can be collected. The photodetectors array is then hybridized on the readout circuit comprising the amplifiers. Photoelectrons are collected by simple photodiodes. No storage grid is used. No photogrid structure (such as CCDs) is known that can isolate pixels from each other, such that undesirable charges arrive in adjacent pixels.

PRESENTATION OF THE INVENTION

The invention proposes a structure comprising a photodetectors array for which the area is entirely reserved for collection of light and for which detection operates with a capacitive grid (called photogrid) for storage of electrical charges. Such a structure also has the special feature that it electrically separates photodetectors due to dielectric walls of the photogrid. A photodetection structure is obtained by hybridizing the photodetectors array with a grid and common base in an amplifier circuit.

Therefore, the purpose of the invention is a photodetectors array that will be hybridized on a readout circuit and realized from a wafer of semiconducting material with one face for reception of light to be detected and one opposite face called the hybridizing face, characterized in that the wafer is divided into pixels, each pixel forming a photodetector, the pixels being separated from each other by separation means formed transversely in the wafer and comprising a photogrid for photodetectors, each photodetector having a connection pad on the hybridizing face to hybridize the photodetectors array to the readout circuit.

According to a first embodiment, the separation means comprise walls comprising an electrically conducting skin sandwiched between electrically insulating skins, thus forming a MOS type photogrid with the semiconducting material in the wafer adjacent to the wall, each photodetector comprising a first doped area and a second doped area, the first doped areas forming electrical contacts with photodetector connection pads, the second doped areas forming electrical contacts with a first common electrode called the pixels common base electrode located on the hybridizing face, the electrically conducting skins of the walls being connected to a second common electrode located on the hybridizing face.

Advantageously, the first common electrode and the second common electrode form interdigitized combs.

If the semiconducting material is made of silicon, the electrically conducting skin of the walls may be made of doped polysilicon and the electrically insulating skins of the walls may be made of silicon oxide.

According to one variant embodiment, the first doped areas are sufficiently large to reach the MOS type photogrid.

According to a second embodiment, the separation means comprise walls comprising an electrically conducting skin opening onto the hybridizing face of the wafer and being prolonged inside the wafer being covered with a layer of electrically insulating material as far as a top that does not reach the light reception face, thus forming a MOS type photogrid with the semiconducting material in the wafer adjacent to the wall, each photodetector comprising a first doped area and a second doped area, the first doped areas forming electrical contact areas with photodetector connection pads, the second doped areas being located between the light reception face and the top of the walls, forming electrical contact areas with a first common electrode located on the light reception face, the hybridizing face supporting a second common electrode electrically connecting the electrically conducting skins of walls that lead into it.

Advantageously, the photodetectors array comprises electrical connection means passing through the wafer of semiconducting material to connect the first common electrode to a conducting strip located on the hybridizing face.

Advantageously, the first common electrode comprises electrical conductors with a shape capable of reflecting light to be detected towards the parts of the reception face without electrical conductors. This shape of electrical conductors may be a tip directed towards the light to be detected.

Advantageously, the second common electrode presents parts facing the wafer of semiconducting material with an area selected to reflect a fraction of the light to be detected that passes through the wafer of semiconducting material, onto the semiconducting material.

If the semiconducting material is made of silicon, the electrically conducting skin may be made of doped polysilicon and the layer of electrically insulating material may be made of silicon oxide.

According to one variant embodiment, the first doped areas are sufficiently extended to reach the MOS type photogrid.

The doped areas are possibly multiple doped areas with a different depth and an identical or complementary type.

According to yet another embodiment, the walls comprising an electrically conducting skin are aligned in a first direction, insulating walls being aligned in a second direction transverse to the first direction, the electrically conducting skins forming independent photogrid control lines.

BRIEF DESCRIPTION OF THE DRAWINGS

The invention will be better understood and other advantages and special features will become clear after readouting the following description, given as a non-limitative example, accompanied by the attached drawings in which:

FIG. 4 is a cross-sectional view of a photodetectors array hybridized on a readout circuit according to second embodiment of the invention, FIG. 5 is a cross-sectional view of a variant embodiment of a photodetectors array hybridized on a readout circuit according to the second embodiment of the invention.

DETAILED DESCRIPTION OF EMBODIMENTS OF THE INVENTION

Figure 1:
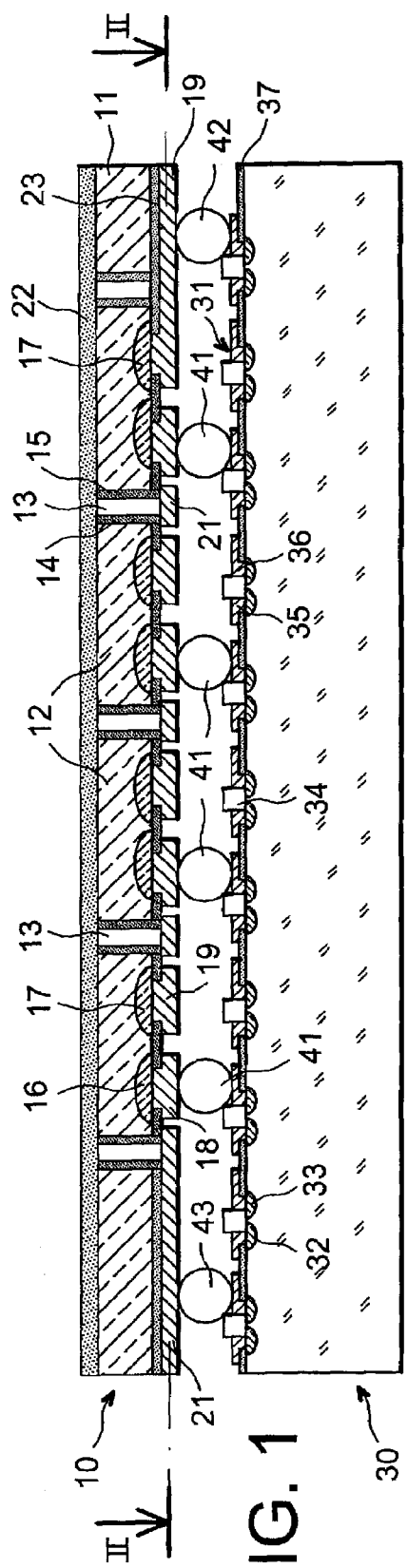
FIG. 1 is a cross-sectional view of a photodetectors array hybridized on a readout circuit, according to a first embodiment of the invention.

FIG. 1 is a cross-sectional view of a photodetectors array hybridized on a readout circuit, according to a first embodiment of the invention.

The photodetectors array 10 is realized from a wafer of semi-conducting material 11 divided into pixels or photodetectors 12 by walls arranged transversely with respect to the wafer 11 and to its entire thickness. The walls comprise an electrically conducting skin 13 sandwiched between two electrically insulating skins 14 and 15. An insulating skin sandwiched between the semiconducting material and an electrically conducting skin forms a MOS capacitor. To maximize the value of the capacitance of the capacitor, the thickness of the insulator is chosen to be as thin as possible while remaining sufficient so that there is no breakdown under the applied voltages.

Each pixel 12 comprises two complementary doped areas to form the contact between the metal and the semiconductor and collection of charges. The doped area 16 forms the contact with the connection pad 18 of the photodetector. The doped area 17 makes the contact with the electrode 19 that is a common electrode for all photodetectors.

The conducting skins 13 are electrically connected on the hybridizing face, to an electrode 21 that is a common electrode for all conducting skins of the walls.

The photodetectors array 10 is covered on the face that will receive light to be detected, by a transparent electrically insulating layer 22. On its hybridizing face, it is covered by an electrically insulating layer 23 with local openings through which the various electrical connections can be made.

FIG. 1 also shows a readout circuit 30 associated with the photodetectors array 10. The readout circuit 30 is made on a silicon substrate. Amplifiers and CMOS processing circuits 31 (or bipolar or BiCMOS circuits) were made on the substrate in a known manner. For example, the P or N doping areas 32 and 33, polysilicon grids 34, drain contacts 35 and source contacts 36, and an etched layer of silicon oxide 37, can be recognized.

The photodetectors array 10 is hybridized on the readout circuit 30 using solder balls. The connection pads 18 of the photodetectors are connected to the readout circuit through balls 41. The common electrode 19 is connected to the readout circuit through balls 42. The common electrode 21 is connected to the readout circuit through balls 43.

Figure 2:
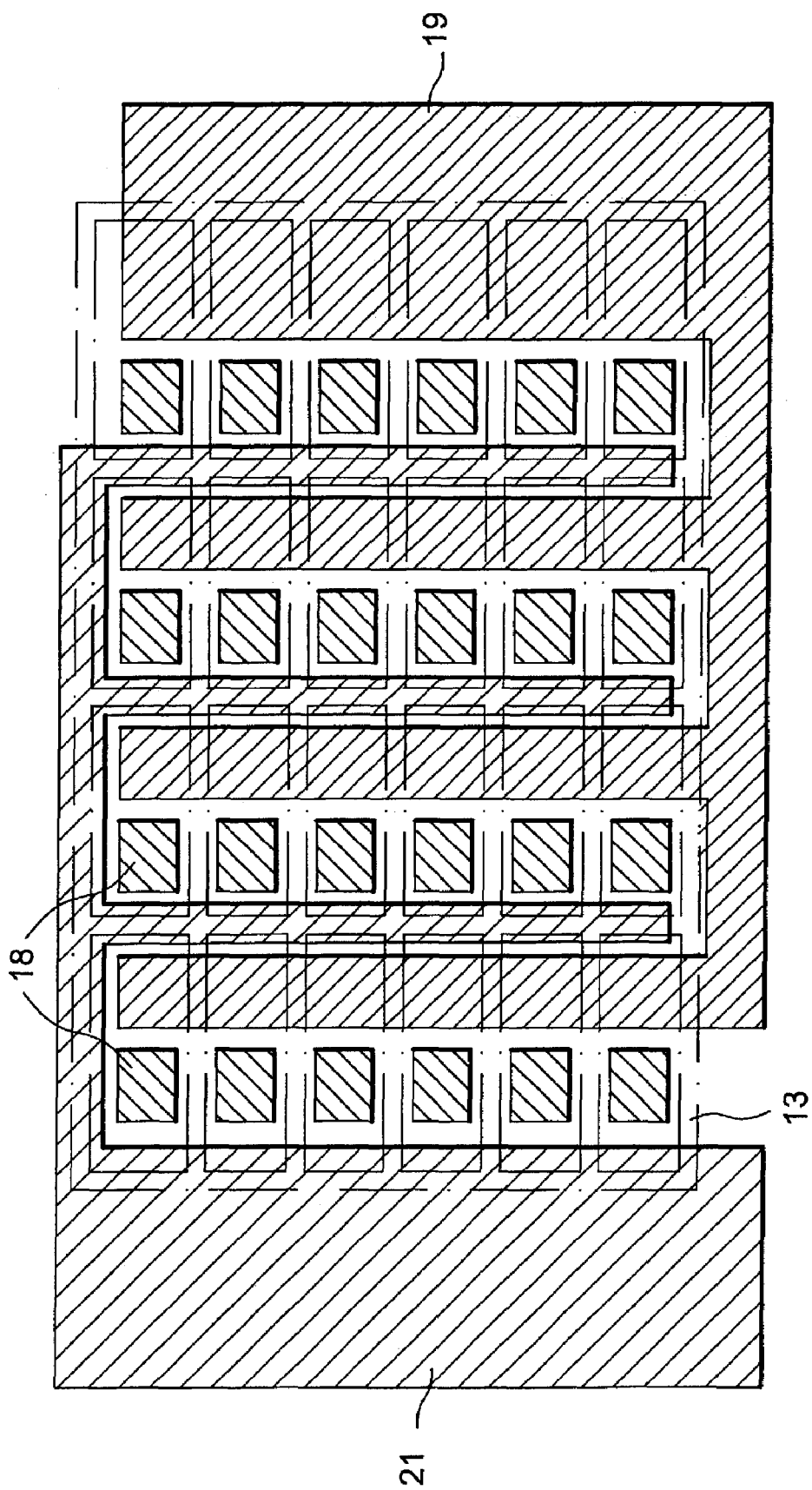
FIG. 2 is a top view of FIG. 1 shown in section II-II.

FIG. 2 is a top view of FIG. 1 along section II-II. It shows the arrangement of the different electrodes and connection pads on the hybridizing face of the photodetectors array. It can be seen that the common electrode 21 and the common electrode 19 form interdigitized combs. The connection pads 18 form sections. The electrically conducting skins 13 of the walls have been shown in chain dotted lines.

Figure 3:
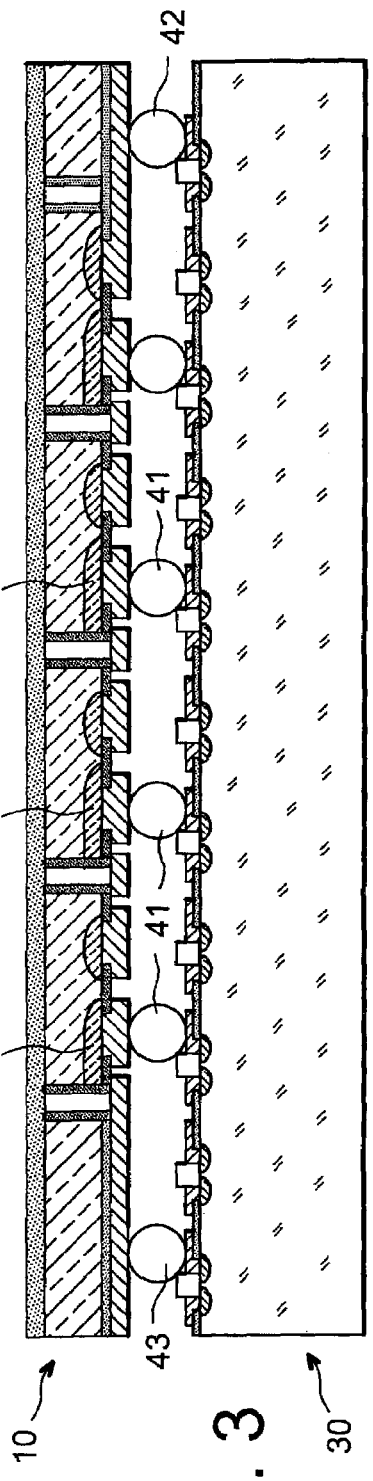
FIG. 3 is a cross-sectional view of a variant embodiment of a photodetectors array hybridized on a readout circuit according to a first embodiment of the invention.

FIG. 3 is a cross-sectional view of a variant embodiment of a photodetectors array on a readout circuit, according to a first embodiment of the invention. The photodetectors array is practically identical to that shown in FIG. 1, except for doped areas 16 corresponding to photodetector connection pads. These doped areas 16 are such that the distance between each doped area 16 and the capacitor charge storage area is reduced. In fact, the doped area 16 is extended all along the walls. There is one area of overlap of the MOS capacitor and the doped area 16, in a conventional manner for MOS transistors.

FIG. 4 is a cross-sectional view of a hybridized photodetectors array on a readout circuit, according to a second embodiment of the invention.

The photodetectors array 50 is built up from a wafer of semiconducting material 51 divided into pixels or photodetectors 52 by walls arranged transversely to the wafer 51 and within part of its thickness. The walls comprise an electrically conducting skin 53 opening up onto the hybridizing face of the wafer 51 and covered by a layer of electrically insulating material 54 extending along the hybridizing face of the photodetectors array. The top of the wall thus formed leaves an area of semiconducting material free before the reception face of the light from wafer 51. These walls form a MOS capacitor.

The part 57 of the semiconducting material between the insulating layer located on the top of the walls and the face of the wafer 51 on which light to be detected will be received, is doped and is in contact with an electrical conductor of a first common electrode 59. Therefore the pixels are electrically separated. In fact, doping of this part 57 in contact with the electrical conductor 59 connected to a reference potential, prevents the transfer of charges from one pixel to another.

Each pixel 52 comprises a doped area 56 near its center in a manner complementary to the doped area 57 and located on the hybridizing face of the photodetectors array. Doped areas 56 are in electrical contact with the corresponding connection pads 58.

The photodetectors array 50 is covered by an electrically insulating layer 62 on the side that will receive light to be detected, and there are local openings in this layer to make the various electrical connections. On its hybridizing face, it is covered by an extension to the electrically insulating layer 54 in which there are local openings to make the various electrical connections.

Therefore, the face of the photodetectors array that will receive light to be detected supports a first common electrode 59. The parts of this first common electrode 59 located to the left and right of the figure are electrically connected to contact strips 69 located on the hybridizing face of the photodetectors array, through conducting crossings 79.

The first common electrode 59 forms a narrow grid so that the semiconducting material of the array receives a maximum amount of light. The electrical conductors of this electrode are preferably sharpened to a point to reflect incident light towards non-metallized parts of the light reception face.

On the hybridizing face, the conducting skins 53 are electrically connected to an electrode 61 that forms the second common electrode. The electrode 61 covers a maximum area to reflect light that could not be absorbed towards the semiconducting material.

FIG. 4 also shows a readout circuit 30 associated with the photodetectors array 50. It is similar to that in FIG. 1.

The photodetectors array 50 is hybridized on the readout circuit 30 through solder balls. The connection pads 58 of the photodetectors are connected to the readout circuit through balls 71. The first common electrode 59 is connected to the readout circuit by balls 72 through conducting crossings 79 and contact strips 69. The second common electrode 61 is connected to the readout circuit by balls 73.

FIG. 5 is a cross-sectional view of a variant embodiment of a photodetectors array on a readout circuit according to the second embodiment of the invention. The photodetectors array is practically identical to that shown in FIG. 4 except for the doped areas 56 that are doped areas corresponding to the photodetector connection pads. The doped areas 56 have been extended to come into contact with the capacitor. There is an overlap area between the doped areas 56 and the second common electrode 61.

The reduction in the electrical distance between the capacitor and the connection pad enables a better transfer of charges stored in the channel of the light cell. In the case of the device in FIG. 4, the area of semiconducting material remaining between the capacitor and the doped area 56 enables a redistribution of charges stored in the entire pixel at the time that the grid potential is changed over. In the variant shown in FIG. 5, elimination of this area enables a fast transfer of charges directly from the grid to the connection pad at the time that the grid potential is changed over. The extension of doped areas facilitates the recombination of carriers generated by light and therefore reduces the detected signal. One of the two variants, or even an intermediate case, will be preferred, depending on the type of light signal to be detected.

Other variants are possible by replacing single-doped areas 16, 17, 56 by multi-doped areas with an identical or complementary type at different depths.

The structures illustrated in FIGS. 1 to 5 are particularly interesting special cases of the production of photogrid light detectors with isolated pixels. Simple variants can easily be deduced from them if only part of the walls is used to create the capacitance. In particular, a structure in which the walls in one direction are used for capacitance and the walls in the perpendicular direction are used to make contact with doped areas connected on the illuminated surface. Similarly, the pixels described are rectangular but triangular or hexagonal pixels, or even pixels with variable sizes, could be used depending on the constraints of the overall imagery or measurement system.

Another variant is the case in which the walls in one direction act as a capacitance and the walls in the other direction are isolating. Each row or each column in the photogrid can then be connected to a different metallic track and may be controlled independently.

The dimensions of the photodetectors array are variable depending on the applications. For example, the thickness of the wafer or semiconducting material is variable from a few µm to a few tens of µm. The width of the pixels may be approximately equal to the thickness of the wafer. The height of the walls is approximately equal to or less than the thickness of the wafer. The thickness of the insulating layer of the walls is of the order of 0.1 µm. Doped areas are smaller than or the same size as the pixels and may be very thin (less than 0.1 µm). Arrays may comprise a few tens to a few million pixels.

Figure 6A:
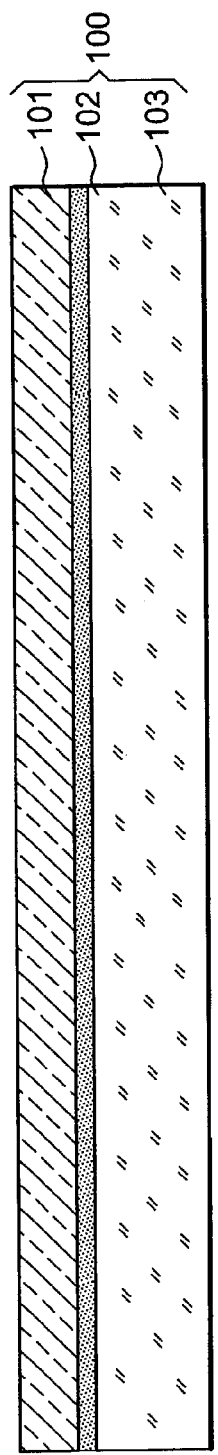
FIGS. 6A to 6N illustrate the production of a photodetectors array hybridized on a readout circuit according to the second embodiment of the invention.
Figure 6B:
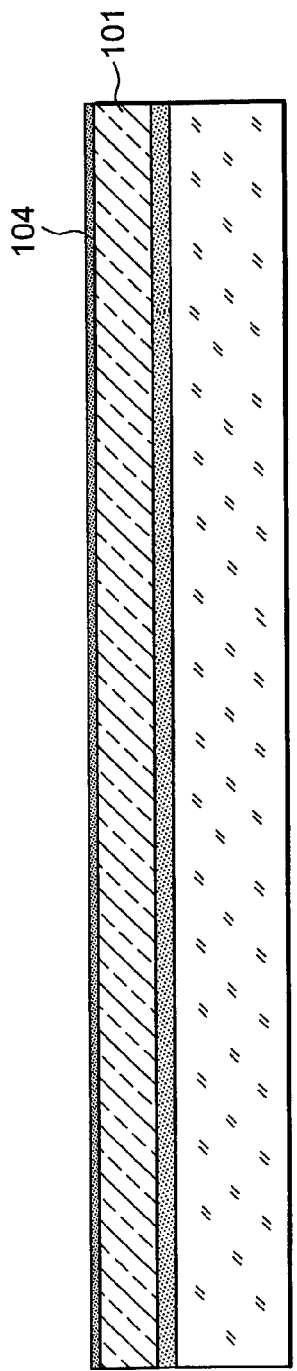
Figure 6C:
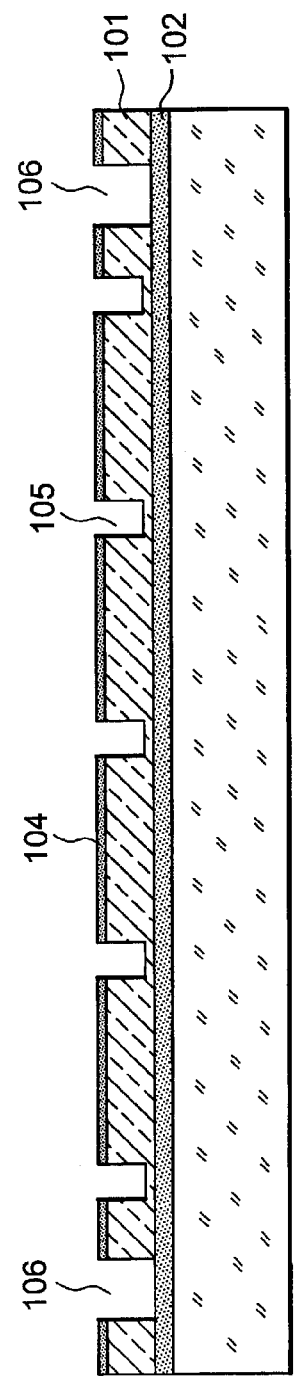
Figure 6G:
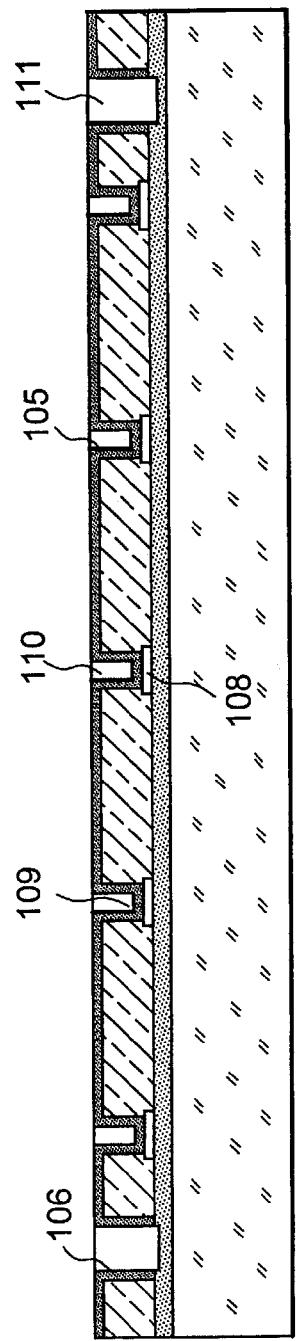
Figure 6H:
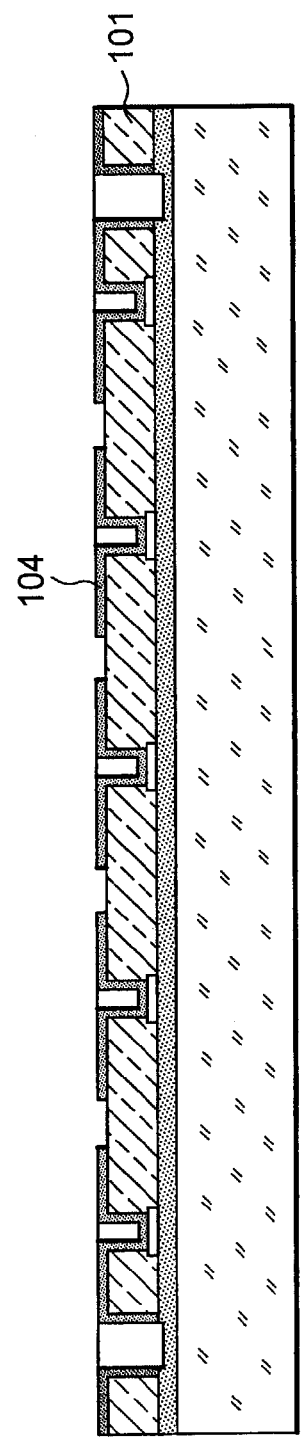
Figure 6I:
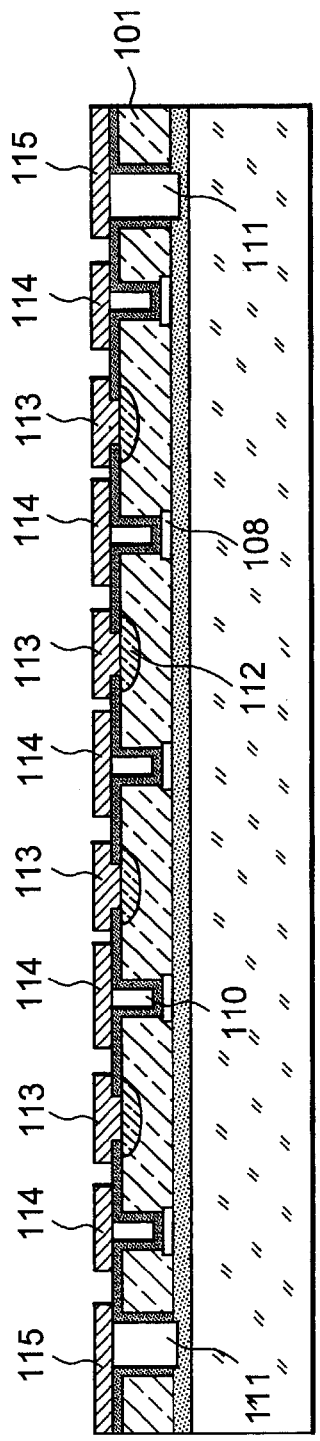
Figure 6J:
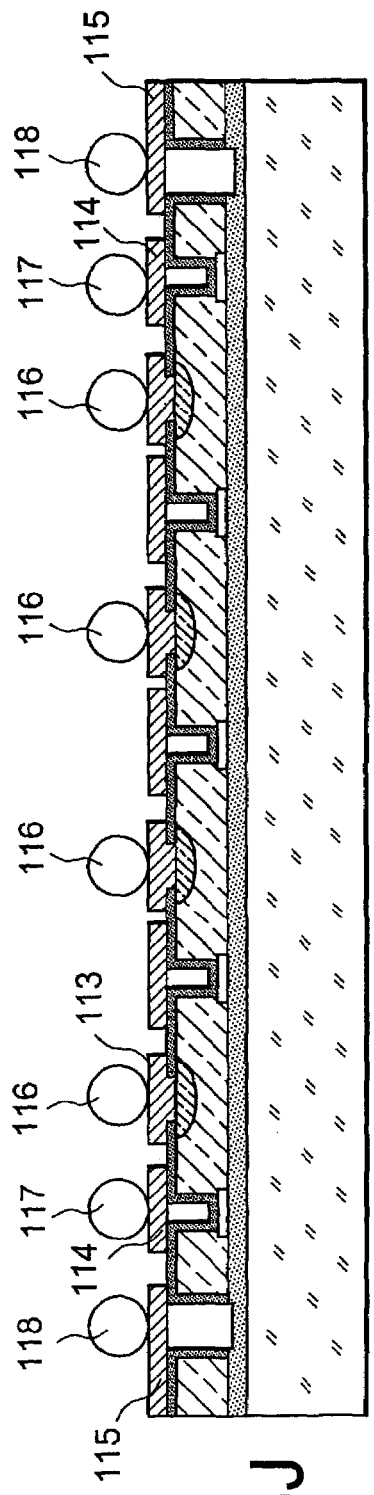
Figure 6K:
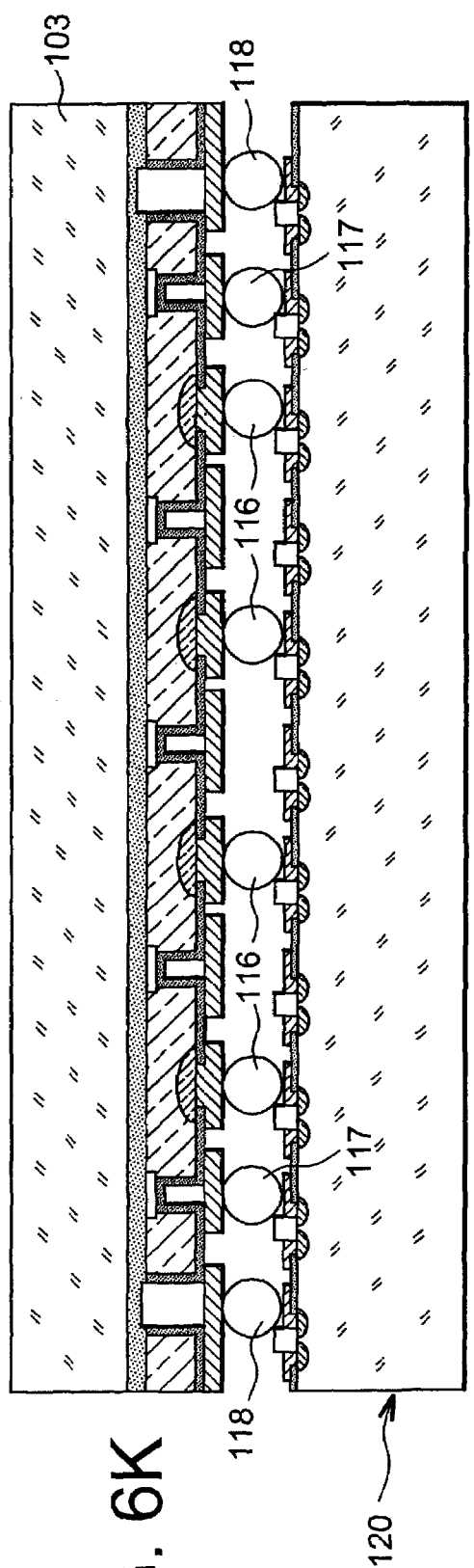
Figure 6N:
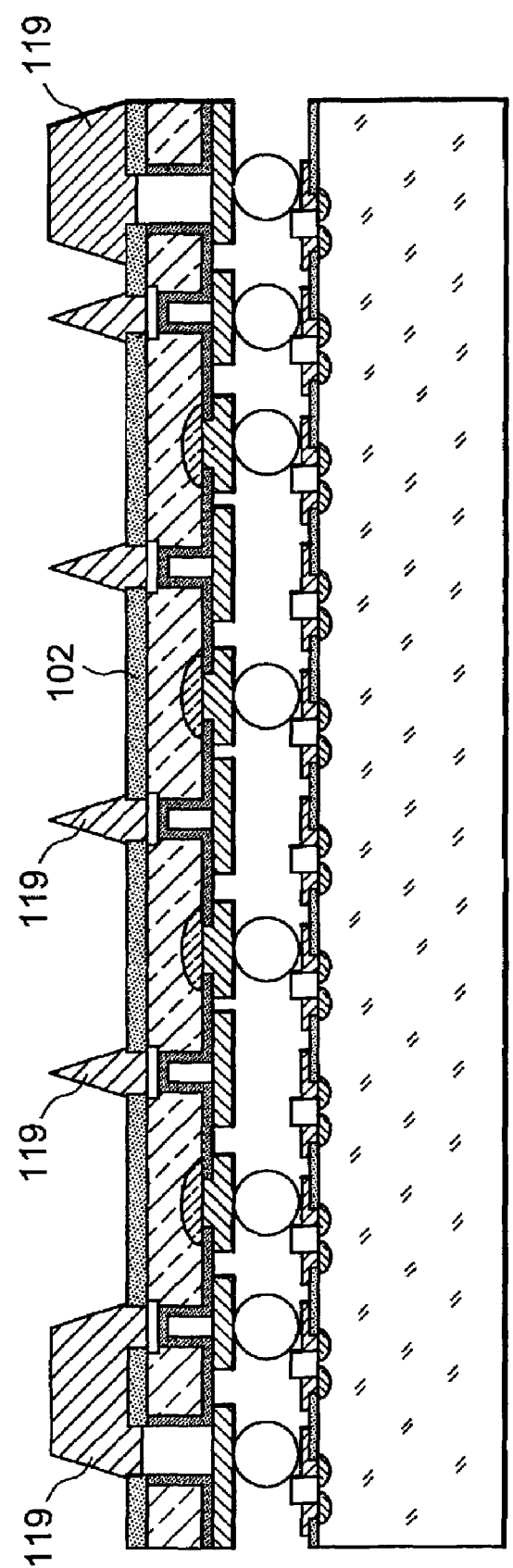

FIGS. 6A to 6N illustrate the construction of a photodetectors array hybridized on a readout circuit according to a second embodiment of the invention. FIGS. 6A to 6I illustrate the construction of the photodetectors array only. FIGS. 6J to 6N illustrate hybridizing of the photodetectors array to its readout circuit. All these figures are cross-sectional views.

FIG. 6A shows an SOI substrate 100 composed of a silicon support 103 supporting a silicon oxide layer 102 followed by a thin silicon layer 101.

An oxidation step is then carried out on the thin silicon layer 101 to obtain a surface and protection passivation layer 104 (see FIG. 6B). The thickness of the layer 104 is of the order of 0.5 µm.

Trenches are then made in the thin layer 101. To achieve this, a resin layer is firstly deposited on the oxide layer 104, and is then photolithographed to etch the oxide layer 104 at the locations planned for the trenches. After the oxide layer 104 has been etched, the resin is removed. The trenches are then etched in the thin silicon layer 101. The inner trenches 105 are shorter than the outer trenches 106. The result is that the trenches 105 do not reach the buried oxide layer 102, while the trenches 106 do reach the layer 102, etching being faster in the large patterns than in the small patterns. This is shown in FIG. 6C.

The next step is surface oxidation of visible silicon parts to obtain a continuous surface insulating layer 104-107 of the thin layer of silicon 101. This is shown in FIG. 6D.

The next step is anisotropic etching of the oxide to eliminate the oxide layer present at the bottom of the trenches 105 and to expose the semiconducting material 101 at the bottom of these trenches. However, the initial oxide layer 104 on the thin silicon layer 101 and the buried oxide layer 102 are still sufficiently thick. This is shown in FIG. 6E.

Doping agents are then implanted in the exposed parts of the thin layer of semiconducting material 101 at the bottom of the trenches 105. The next step is diffusion of doping agents by annealing to obtain the doped areas 108 as shown in FIG. 6F.

FIG. 6G shows the structure obtained after the following operations:
  surface oxidation to obtain an isolation layer 101 on the doped areas 108,
  filling in the trenches 105 and 106 by a conducting material, for example polysilicon,
  elimination of the surplus filling by mechanical-chemical polishing to obtain electrically conducting skins 110 and conducting crossings 111.

A resin layer is then deposited on the oxide layer 104. The oxide layer 104 is etched by photolithography of the resin to locally expose the thin layer of semiconducting material 101. This is shown in FIG. 6H.

Doping agents complementary to the doping agents in areas 108 are implanted in the exposed parts of the thin layer 101 to obtain the doped areas 112 (see FIG. 6I). The remaining resin is removed. A metallic layer is then uniformly deposited. A resin layer is deposited on this metallic layer. The metallic layer is etched by photolithography and the resin is removed. The result is connection pads 113 on the surface electrically connecting the doped areas 112, a common electrode 114 being electrically connected to the conducting skins 110 and the contact strips 115 connected to the conducting crossings 111.

FIG. 6J shows the structure obtained after the formation of conducting balls 116 on the connection pads 113, conducting balls 117 on the common electrode 114, and conducting balls 118 on the contact strips 115. Another way is to form solder balls on the readout circuit.

FIG. 6K shows the result of "flip chip" hybridizing of the photodetectors array on a readout circuit 120 using solder balls 116, 117 and 118. An insulating material may be used for filling between the photodetectors array and the readout circuit.

The next step is to eliminate the support 103 of the initial SOI substrate. This elimination may be done by polishing and/or etching with stopping on the oxide layer 102 as shown in FIG. 6L.

A resin layer is then deposited on the oxide layer 102. The oxide layer 102 is then etched by a photolithography to expose the conducting crossings 111 and the implanted areas 108. The resin is removed. The structure shown on FIG. 6M is then obtained.

A metallic layer is deposited on the etched oxide layer 102. A resin layer is deposited on the metallic layer. The metallic layer is then etched by photolithography, with control of the slope of etchings. The resin is removed and the structure shown on FIG. 6N is obtained comprising the common electrode 119 on the light reception face to be detected.

Other steps may follow, for example a step to cut structures into chips after a collective process. Before this cutting out step, other steps may be added to create filters or anti-reflection layers. The order of the steps is not necessarily the order mentioned above.

The photodetectors array according to the invention has a capacitive grid. The special feature of this charge storage capacitance is that it improves the performance of detection. It accumulates charges so that they can be transferred simultaneously to the amplifiers. Its position on the skins of the pixels results in high capacitance without occupying any space in the structure. The skin of the isolated pixels thus has a large area, frequently greater than the illuminated area of the pixel and favorable to large storage. There is no increase in the size of the pixels. All known advantages on other structures according to prior art are maintained:

- the entire surface of the array contributes to collecting light,
- pixels are electrically isolated from each other and cannot exchange their charges,
- interconnection resistances are minimal,
- hybridizing is kept on an amplifier circuit,
- the number of connections with the amplifier circuit is minimum,
- the size of the doped areas can be adjusted depending on the optical signal to be detected,
- light losses are minimized by reflection on the front and back faces of the conducting metallizations,
- all output contacts of signals towards the outside may be taken on the upper face of the array at the edge of the illuminated area,
- it is always possible to add optical components such as an anti-reflection layer or an optical filter or a light concentrator.

The invention claimed is:

1. An array of photodetectors configured from a wafer of semiconducting material with one light reception face configured to receive light to be detected and a hybridizing face arranged opposite to the light reception face, wherein the wafer is divided into pixels, each pixel forming a photodetector, the pixels being separated from each other by separators formed transversally in the wafer, the separators each configured to store electrical charges and constituting a capacitive grid for the photodetectors, each photodetector having a connection pad on the hybridizing face to hybridize the array of photodetectors to a readout circuit.

2. The array of photodetectors according to claim 1, wherein the separators each comprising an electrically conducting skin sandwiched between electrically insulating skins so as to form a MOS type capacitive grid with the semiconducting material in the wafer adjacent to the separator, each photodetector comprising a first doped area and a second doped area, the first doped areas forming electrical contacts with photodetector connection pads, the second doped areas forming electrical contacts with a first common electrode located on the hybridizing face, the electrically conducting skins of the separators being connected to a second common electrode located on the hybridizing face.

3. The array of photodetectors according to claim 2, wherein the first common electrode and the second common electrode form interdigitized combs.

4. The array of photodetectors according to claim 2, wherein the semiconducting material includes silicon, the electrically conducting skin of the separator includes doped polysilicon and the electrically insulating skins of the separator include silicon oxide.

5. The array of photodetectors according to claim 2, wherein the first doped areas reaches the separator.

6. The array of photodetectors according to claim 1, wherein the separators each comprises an electrically conducting skin sandwiched between electrically insulating skins and an electrically insulating layer formed on a top of the electrically conducting skin so that the top of the electrically conducting skin does not reach the light reception face, each photodetector comprising a first doped area and a second doped area, the first doped areas forming electrical contact areas with photodetector connection pads, the second doped areas being located between the light reception face and the top of the electrically conducting skin and forming electrical contact areas with a first common electrode located on the light reception face, the hybridizing face supporting a second common electrode electrically connecting the electrically conducting skins of the separators.

7. The array of photodetectors according to claim 6, further comprising electrical connection means passing through the wafer of semiconducting material to connect the first common electrode to a conducting strip located on the hybridizing face.

8. The array of photodetectors according to either of claim 6 or 7, wherein the first common electrode comprises electrical conductors with a shape capable of reflecting light to be detected towards the parts of the reception face without electrical conductors.

9. The array of photodetectors according to claim 8, wherein said shape of the electrical conductors is a tip directed towards the light to be detected.

10. The array of photodetectors according to claim 8, wherein the second common electrode presents parts facing the wafer of semiconducting material with an area adapted to reflect a fraction of the light to be detected that passes through the wafer of semiconducting material, onto the semiconducting material.

11. The array of photodetectors according to claim 10, wherein the semiconducting material includes silicon, the electrically conducting skin includes doped polysilicon and the electrically insulating layer includes silicon oxide.

12. The array of photodetectors according to claim 11, wherein the first doped areas reaches the separator.

13. The array of photodetectors according to claim 2, wherein the first and second doped areas are multiple doped areas with a different depth and an identical or complementary type of doping.

14. The array of photodetectors according to claim 2, wherein the electrically conducting skins are aligned in a first direction, the insulating skins being aligned in a second direction transverse to the first direction, the electrically conducting skins forming independent capacitive grid control lines.

15. The array of photodetectors according to claim 1, wherein the separators each comprises an electrically conducting skin sandwiched between electrically insulating skins so as to form the capacitive grid.

* * * * *